United States Patent
Kobayashi et al.

(10) Patent No.: US 10,622,373 B2
(45) Date of Patent: Apr. 14, 2020

(54) STORAGE DEVICE

(71) Applicant: TOSHIBA MEMORY CORPORATION, Tokyo (JP)

(72) Inventors: Shigeki Kobayashi, Kuwana Mie (JP); Hiroshi Nakaki, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/109,370

(22) Filed: Aug. 22, 2018

(65) Prior Publication Data

US 2019/0172836 A1    Jun. 6, 2019

(30) Foreign Application Priority Data

Dec. 4, 2017    (JP) .................................. 2017-232666

(51) Int. Cl.
*H01L 27/11573*    (2017.01)
*H01L 21/768*    (2006.01)
*H01L 27/11582*    (2017.01)
*H01L 27/11575*    (2017.01)

(52) U.S. Cl.
CPC .. *H01L 27/11573* (2013.01); *H01L 21/76802* (2013.01); *H01L 21/76877* (2013.01); *H01L 27/11575* (2013.01); *H01L 27/11582* (2013.01)

(58) Field of Classification Search
None
See application file for complete search history.

(56) References Cited

U.S. PATENT DOCUMENTS

| 7,936,004 B2 | 5/2011 | Kito et al. |
| 2017/0256563 A1* | 9/2017 | Matsuda ........... H01L 27/11582 |
| 2019/0279878 A1* | 9/2019 | Furukawa ......... H01L 27/11556 |
| 2019/0287997 A1* | 9/2019 | Komiya ............. H01L 27/1157 |

* cited by examiner

*Primary Examiner* — Thien F Tran
(74) *Attorney, Agent, or Firm* — Kim & Stewart LLP

(57) ABSTRACT

A storage device includes a conductive layer, a plurality of electrode layers stacked on the conductive layer, a wiring above the plurality of electrode layers, an interlayer insulating film between the plurality of electrode layers and the wiring, a semiconductor film penetrating the plurality of electrode layers and the interlayer insulating film in a stacking direction of the plurality of electrode layers, a contact plug penetrating the interlayer insulating film in the stacking direction, and connected to each of the plurality of electrode layers, and a conductive film in the vicinity of the contact plug and penetrating at least one of the plurality of electrode layers in the stacking direction. The semiconductor film is electrically connected to the conductive layer and the wiring, and an entire upper end of the conductive film is covered by an insulating layer.

16 Claims, 7 Drawing Sheets

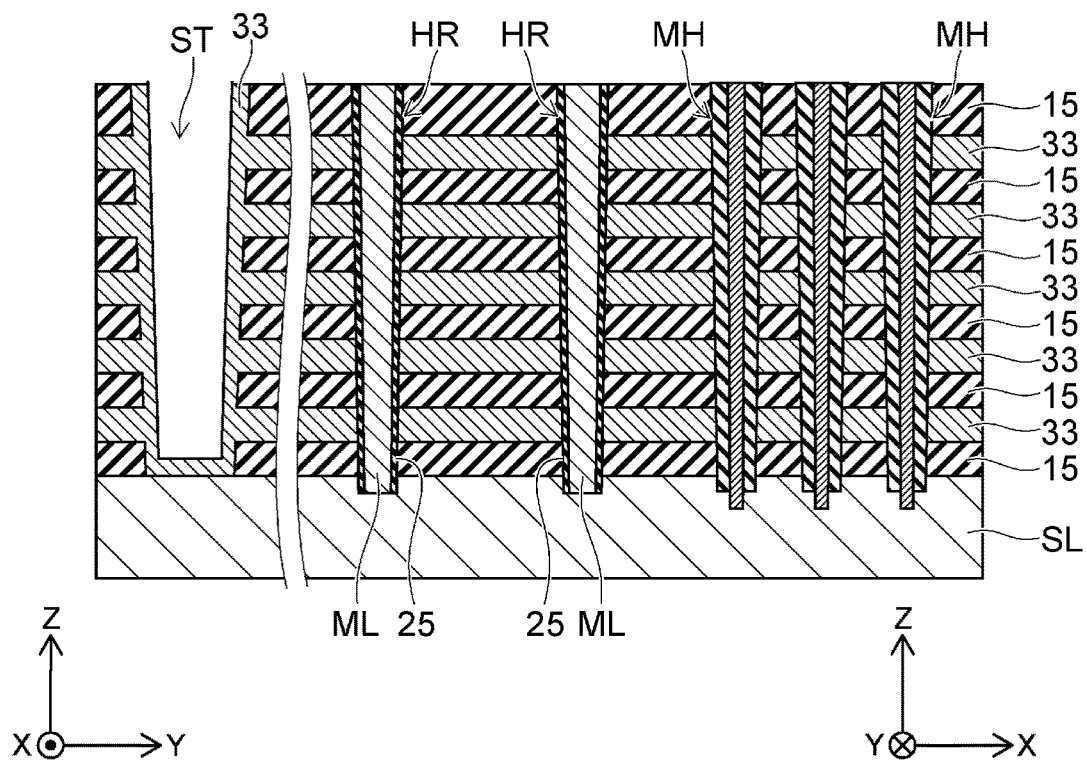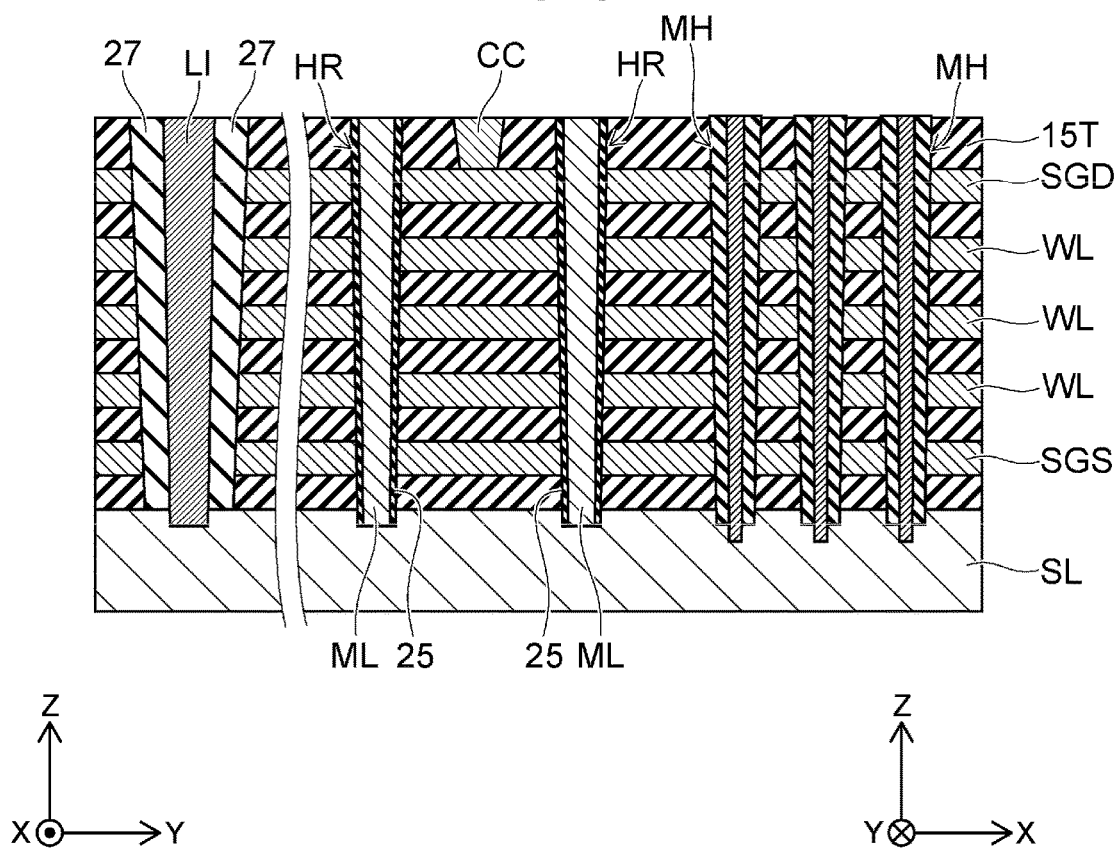

STORAGE DEVICE

CROSS-REFERENCE TO RELATED APPLICATION

This application is based upon and claims the benefit of priority from Japanese Patent Application No. 2017-232666, filed Dec. 4, 2017, the entire contents of which are incorporated herein by reference.

FIELD

An embodiment described herein relates generally to a storage device.

BACKGROUND

A storage device which includes memory cells three-dimensionally arranged has been developed. For example, in a NAND type flash memory, a memory hole is formed to penetrate electrode layers and interlayer insulating films that are alternately stacked. A memory cell is disposed at an intersection of a semiconductor pillar provided inside the memory hole and each of the electrode layers. In the manufacturing process of such a memory device, a manufacturing method is adopted in which sacrificial films and interlayer insulating films which are easy to etch are alternately stacked, a memory hole and a semiconductor pillar penetrating them are formed, the sacrificial films are selectively removed, and electrode layers are formed in the space from which the sacrificial films are removed. However, in order to increase the number of stacked electrode layers to increase the storage capacity, it is necessary to reduce the layer thickness of each interlayer insulating film and each sacrificial film. This is for preventing the etching from becoming excessively difficult by minimizing the overall height of the stacked body of the interlayer insulating films and the sacrificial films as much as possible. However, it is difficult to secure the space after removing the sacrificial films.

DESCRIPTION OF THE DRAWINGS

FIGS. 5A and 5B are schematic cross-sectional views illustrating a manufacturing process following FIG. 4;

DETAILED DESCRIPTION

Figure 1:
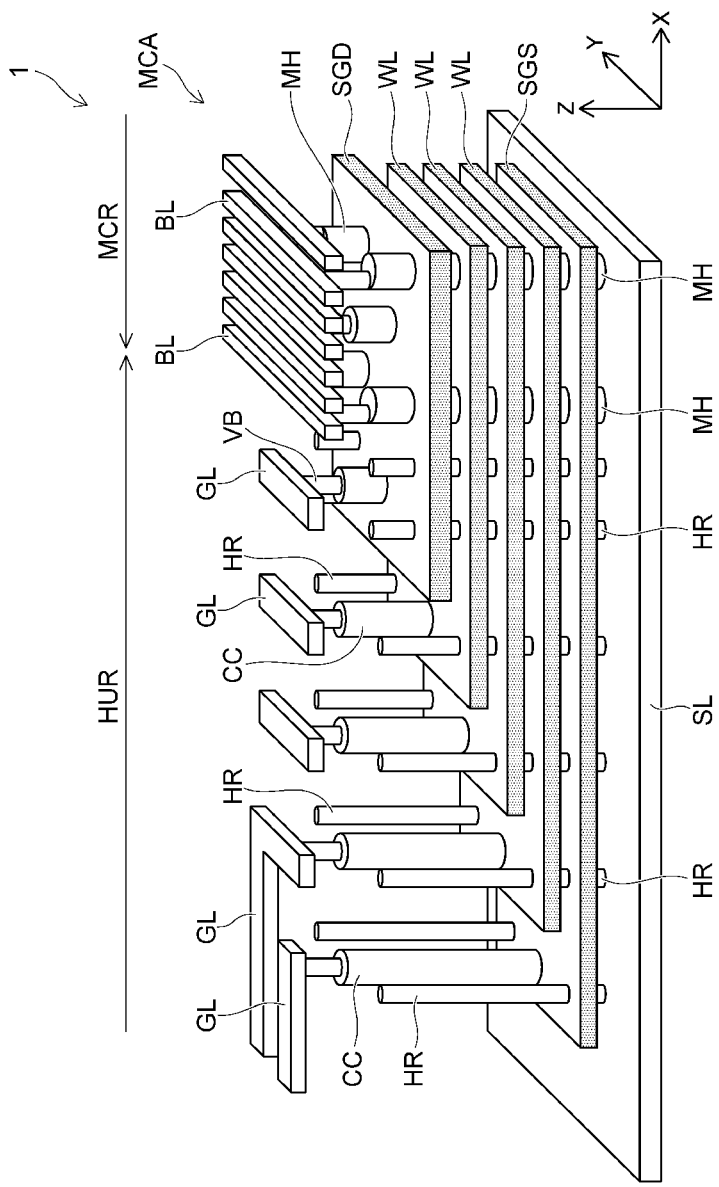
FIG. 1 is a perspective view schematically illustrating a storage device according to an embodiment.

An embodiment provides a storage device capable of increasing the storage capacity by increasing the number of stacked electrode layers.

In general, according to one embodiment, a memory device includes a conductive layer, a plurality of electrode layers stacked on the conductive layer, a wiring above the plurality of electrode layers, an interlayer insulating film between the plurality of electrode layers and the wiring, a semiconductor film penetrating the plurality of electrode layers and the interlayer insulating film in a stacking direction of the plurality of electrode layers, a contact plug penetrating the interlayer insulating film in the stacking direction, and connected to each of the plurality of electrode layers, and a conductive film in the vicinity of the contact plug and penetrating at least one of the plurality of electrode layers in the stacking direction. The semiconductor film is electrically connected to the conductive layer and the wiring, and an entire upper end of the conductive film is covered by an insulating layer.

An embodiment will be described below with reference to the accompanying drawings. The same numbers are assigned to the same portions in the drawings and their detailed description is omitted as appropriate, and different portions will be described. It is noted that the drawings are schematic or conceptual, and relationship between the thickness and width of each portion, and the size ratio between portions do not always represent the actual dimension. Further, even if the same portions are shown, respective dimensions and ratios may be differently shown in some drawings.

Further, the placement and configuration of each portion will be described using an X-axis, a Y-axis and a Z-axis shown in each drawing. The X-axis, Y-axis and Z-axis are mutually orthogonal, and represent the X direction, Y direction and Z direction, respectively. Furthermore, the Z direction may be described as an upward direction, and the opposite direction as a downward direction.

FIG. 1 is a perspective view schematically illustrating a storage device 1 according to an embodiment. The storage device 1 is, for example, a NAND type flash memory, and FIG. 1 is a schematic diagram illustrating a memory cell array MCA. It is noted that, in FIG. 1, an insulating film for electrically insulating each element is not shown.

As shown in FIG. 1, the memory cell array MCA includes a memory cell region MCR and a lead-out region HUR. In the memory cell region MCR, a memory hole MH penetrating a selection gate SGD, a plurality of word lines WL, and a selection gate SGS is provided. The selection gate SGS, the plurality of word lines WL, and the selection gate SGD are stacked on the source layer SL. The source layer SL is, for example, a P-type well or a polysilicon layer provided in a silicon substrate (not shown).

Bit lines BL are provided above the selection gate SGD. Each bit line BL is electrically connected to a semiconductor film SP provided inside the memory hole MH via a connection plug VB (see FIG. 2A).

The lead-out region HUR includes the end portions of the word lines WL, and the selection gates SGS and SGD formed stepwise. Further, the lead-out region HUR includes a plurality of contact plugs CC electrically connected to the word lines WL, and the selection gates SGS and SGD. The contact plugs CC electrically connect word lines WL, and the selection gates SGS and SGD to gate lines GL, respectively.

The lead-out region HUR further includes support holes HR. The support holes HR are provided in the vicinity of the contact plugs CC and penetrate at least one of the plurality of word lines WL, and the selection gates SGS and SGD in the stacking direction.

Figure 2A:
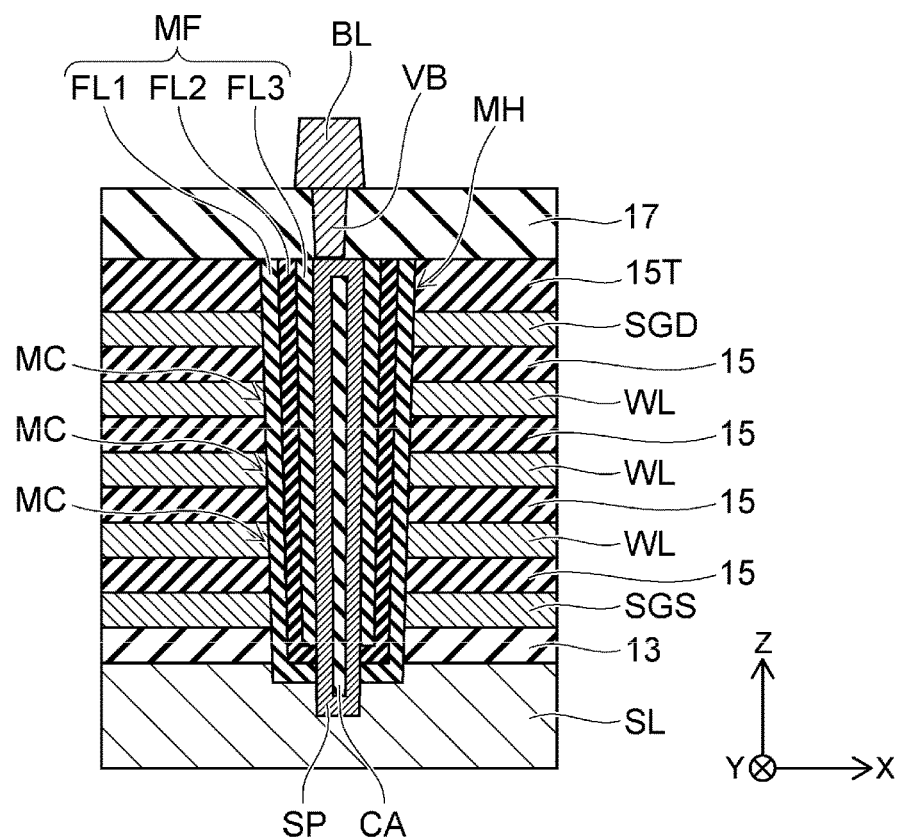
FIGS. 2A and 2B are partial cross-sectional views schematically illustrating the storage device according to the embodiment.
Figure 2B:
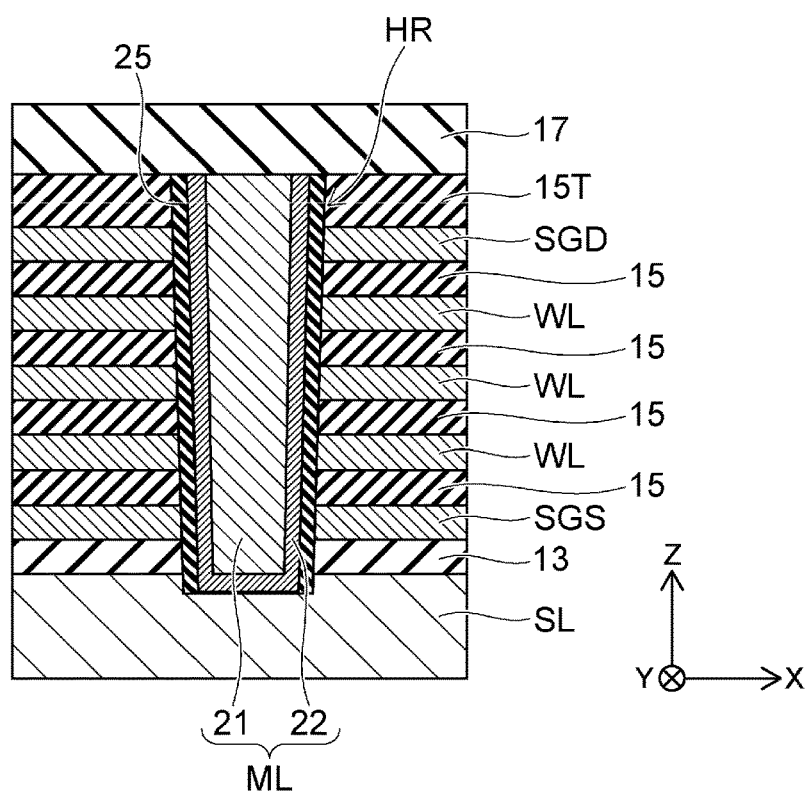

FIGS. 2A and 2B are partial cross-sectional views schematically illustrating the storage device 1 according to the embodiment. FIG. 2A is a schematic diagram illustrating the inside of a memory hole MH. FIG. 2B is a schematic diagram illustrating the inside of a support hole HR.

Figure 3A:
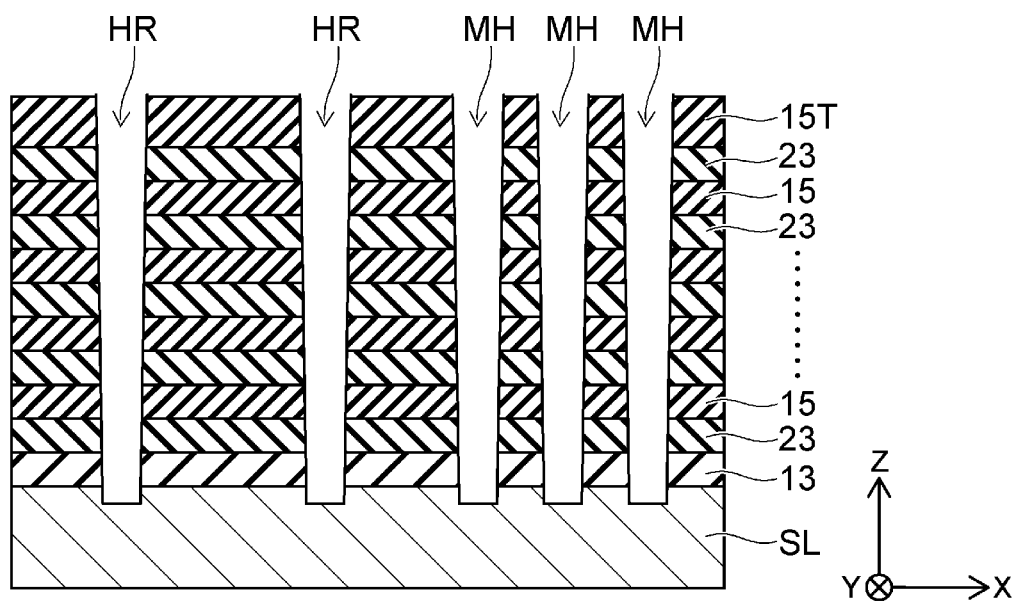
FIGS. 3A and 3B are schematic cross-sectional views illustrating a manufacturing process of the storage device according to the embodiment.

As shown in FIG. 2A, the memory hole MH is provided at a depth reaching the source layer SL through the selection gate SGD, the plurality of word lines WL, the selection gate SGS, and the interlayer insulating films 13 and 15 (see FIG. 3A). A memory film MF, a semiconductor film SP, and an insulating core CA are provided inside the memory hole MH.

The insulating core CA includes, for example, silicon oxide and extends in the Z direction. The semiconductor film SP is, for example, a polysilicon film, and is provided so as to cover the insulating core CA. The semiconductor film SP extends in the Z direction inside the memory hole MH.

The memory film MF is provided between the semiconductor film SP and the word lines WL. The memory film MF covers the side surface of the semiconductor film SP and extends in the Z direction along the semiconductor film SP. The memory film MF has a structure in which, for example, a block insulating film FL1, a charge storage film FL2, and a tunnel insulating film FL3 are stacked, and has a function of holding electric charge. For example, the block insulating film FL1 and the tunnel insulating film FL3 are silicon oxide films, and the charge storage film FL2 is a silicon nitride film. A memory cell MC is provided at an intersection of the semiconductor film SP and each of the word lines WL, and includes a part of the memory film MF.

The semiconductor film SP is electrically connected to the source layer SL at its lower end. Further, the semiconductor film SP is electrically connected to the bit line BL via the connection plug VB connected to the upper end thereof.

As shown in FIG. 2B, the support hole HR is provided at a depth reaching the source layer SL through the selection gate SGD, the plurality of word lines WL, the selection gate SGS, and the interlayer insulating films 13 and 15 (see FIG. 3A). The support hole HR includes a metal film ML and an insulating film 25.

The metal film ML includes a metal core 21 and a metal film 22 (see FIG. 2B). The metal core 21 contains, for example, tungsten (W) and extends in the Z direction. The metal film 22 is, for example, a titanium nitride (TiN) film and is provided so as to cover the metal core 21. The metal film ML is provided so as to make contact with the source layer SL at the lower end thereof, for example. Further, the upper end of the metal film ML is electrically insulated, for example, by an interlayer insulating film 17.

The insulating film 25 is provided between the metal film ML and the inner wall of the support hole HR. The insulating film 25 is located between at least one of the selection gate SGS, the plurality of word lines WL, and the selection gate SGD and the metal film ML, and extends in the Z direction along the metal film ML. The insulating film 25 is, for example, a silicon oxide film, and electrically insulates at least one of the selection gate SGS, the plurality of word lines WL, and the selection gate SGD from the metal film ML.

Next, a method of manufacturing the storage device 1 will be described with reference to FIGS. 3A to 5B. FIGS. 3A to 5B are schematic cross-sectional views illustrating a manufacturing process of the storage device 1 according to an embodiment.

For example, as shown in FIG. 3A, interlayer insulating films 13 and 15 and sacrificial films 23 are formed on the source layer SL. The interlayer insulating films 13 and 15 are, for example, silicon oxide films. The interlayer insulating films 15 and the sacrificial films 23 are alternately stacked on the interlayer insulating film 13. Each interlayer insulating film 15 is, for example, a silicon oxide film. Each sacrificial film 23 is, for example, a silicon nitride film.

For example, the support hole HR is formed at a depth reaching the source layer SL from the upper surface of the uppermost interlayer insulating film 15T. The support hole HR is formed, for example, by using anisotropic RIE (Reactive Ion Etching) to selectively remove the interlayer insulating films 15, the sacrificial films 23, and the interlayer insulating film 13. Subsequently, the insulating film 25 and the metal film ML are formed inside the support hole HR (see FIG. 2B).

Further, the memory hole MH is formed. The memory hole MH is formed, for example, at a depth reaching the source layer SL from the upper surface of the interlayer insulating film 15T. The memory hole MH is formed, for example, after the insulating film 25 and the metal film ML are formed inside the support hole HR.

Figure 3B:
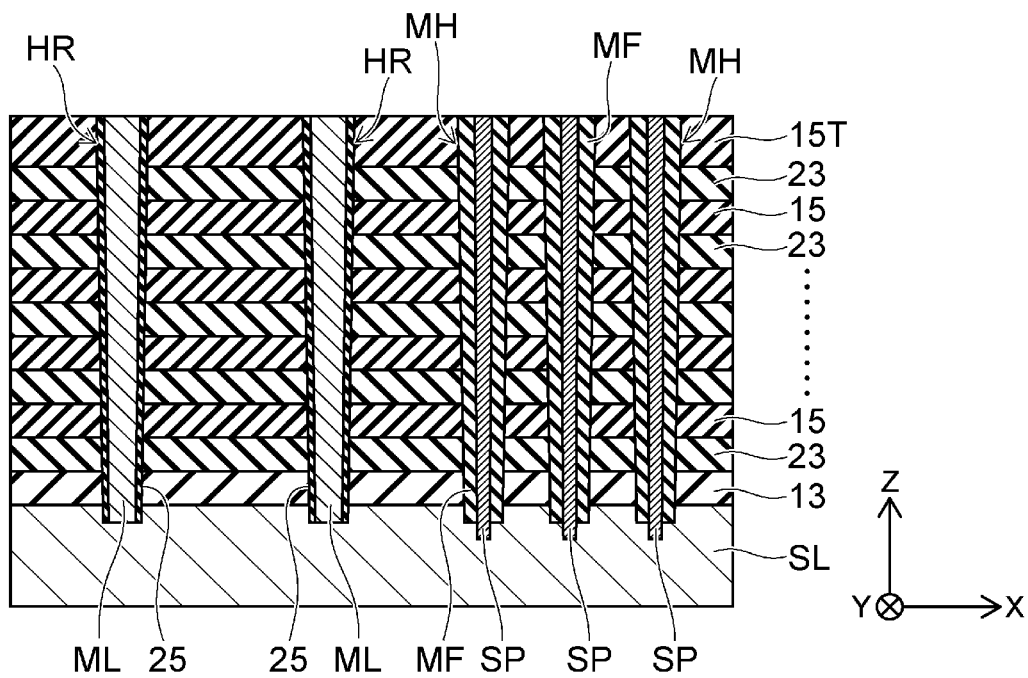

As shown in FIG. 3B, the memory film MF and the semiconductor film SP are formed inside the memory hole MH. For example, after the memory film MF covering the inner surface of the memory hole MH is formed by using ALD (Atomic Layer Deposition), a portion formed on the bottom surface of the memory hole MH is selectively removed using anisotropic RIE. Subsequently, the semiconductor film SP is formed, which in turn is embedded in the memory hole MH. It is noted that in FIG. 3B and the following figures, an insulating core CA is not shown in the memory hole MH.

Figure 4A:
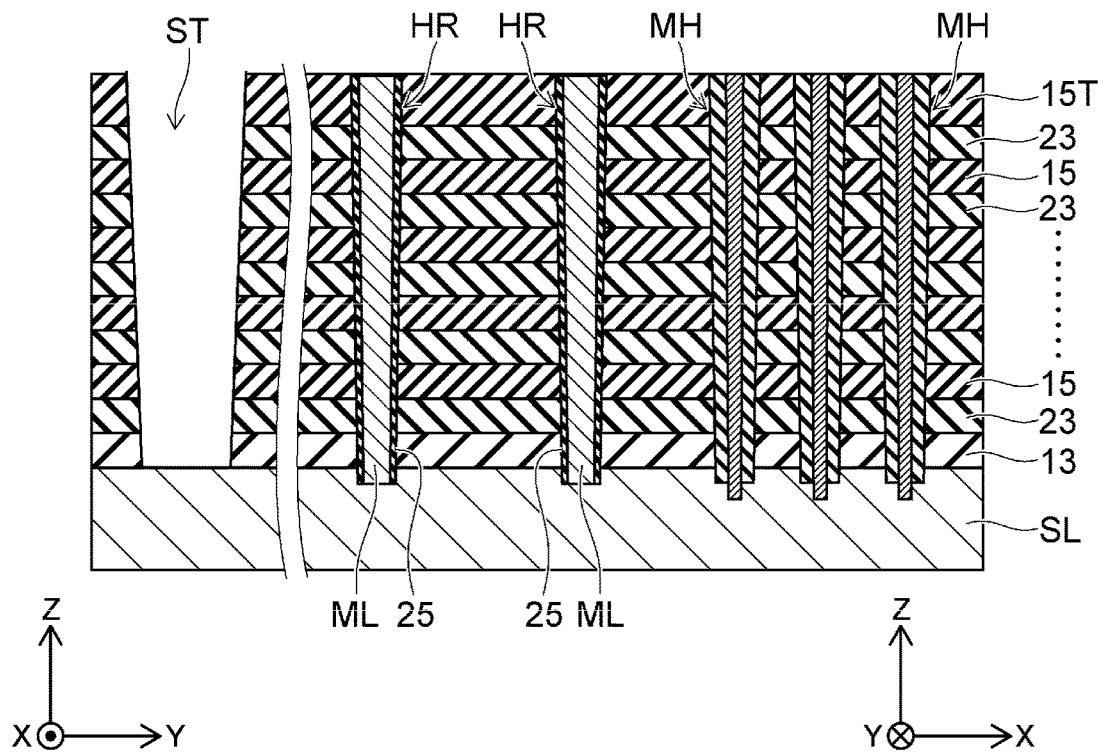
FIGS. 4A and 4B are schematic cross-sectional views illustrating a manufacturing process following FIG. 3.

As shown in FIG. 4A, a slit ST for dividing the interlayer insulating films 13 and 15 and the sacrificial films 23 is formed. For example, the slit has a depth reaching the source layer SL from the upper surface of the interlayer insulating film 15T, and is formed so as to extend in the X direction.

Figure 4B:
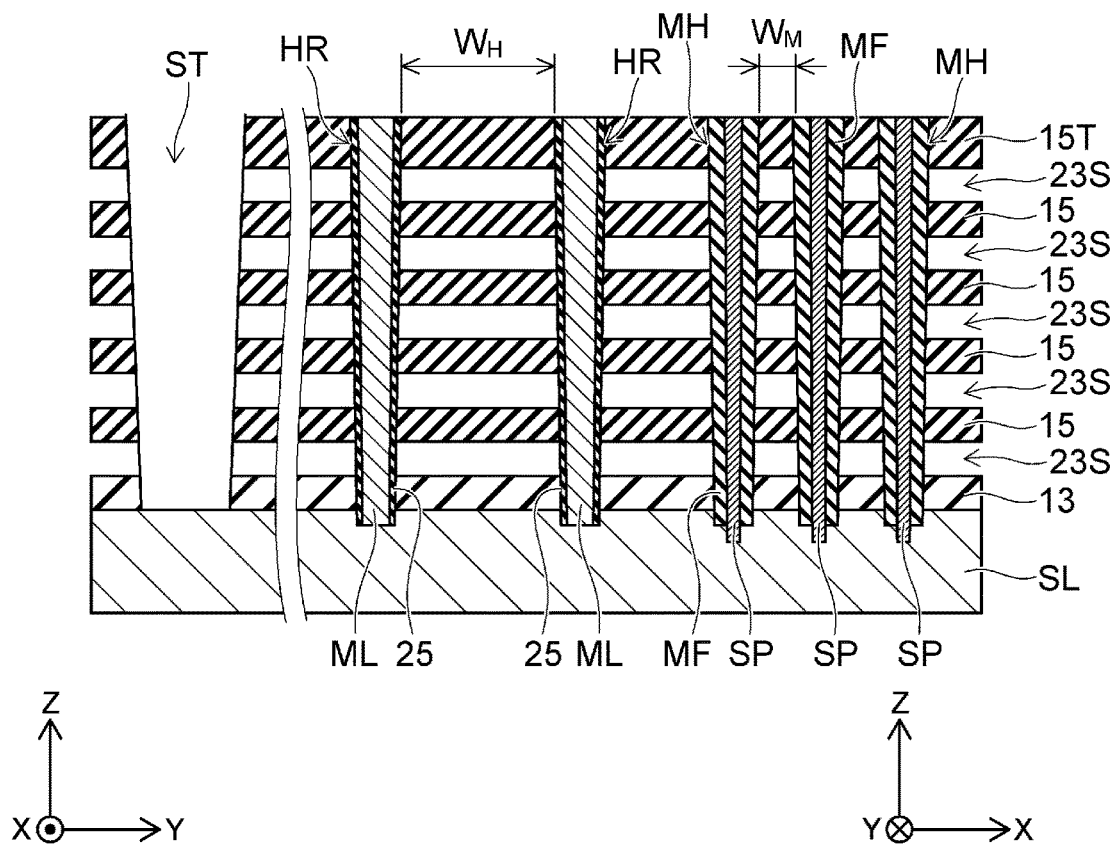

As shown in FIG. 4B, the sacrificial films 23 are selectively removed through the slit ST. For example, the etchant is supplied through the slit ST, and the sacrificial films 23 are selectively removed leaving the interlayer insulating films 13 and 15. By selectively removing the sacrificial films 23, spaces 23S are formed between the interlayer insulating films 15.

Each interlayer insulating film 15 is supported by the memory film MF and the semiconductor film SP formed inside the memory hole MH, the metal film ML formed inside the support hole HR, and the insulating film 25. Thereby, each space 23S can be held. The interval $W_M$ between adjacent memory holes MH is narrower than the interval $W_H$ between adjacent support holes HR.

As shown in FIG. 5A, a metal film 33 is formed inside the spaces 23S through the slit ST. For example, a source gas is supplied into the spaces 23S through the slit ST, and the metal film 33 is deposited. The metal film 33 is, for example, a tungsten (W) film.

As shown in FIG. 5B, a part of the metal film 33 formed on the inner wall of the slit ST is removed to form the selection gate SGS, the plurality of word lines WL and the selection gate SGD. In some cases, a contact LI for electrically connecting the source layer SL and an upper layer wiring (not shown) may be formed inside the slit ST. The contact LI is, for example, a metal film containing tungsten (W), and is electrically insulated from the word lines WL, and the selection gates SGS and SGS by an insulating film 27.

Subsequently, contact plugs CC are formed. The contact plugs CC are connected to the selection gate SGD, the word lines WL, and the selection gate SGS, respectively. The contact plugs CC are formed in the lead-out region HUR, and the support holes HR are located in the vicinity thereof (see FIG. 1).

Further, the interlayer insulating film 17 covering the upper surface of the interlayer insulating film 15T is formed, and the gate lines GL and bit lines BL are formed on the interlayer insulating film 17 (see FIG. 1 and FIG. 2A). The interlayer insulating film 17 is, for example, a silicon oxide film.

The semiconductor film SP is electrically connected to each bit line BL via the connection plug VB formed in the interlayer insulating film 17 and the contact plug CC is connected to each gate line GL via another connection plug VB, respectively (see FIG. 2A and FIG. 1). The bit line BL is connected to, for example, a sense amplifier (not shown) and the gate line GL is connected to, for example, a row decoder (not shown). On the other hand, the upper end of the metal film ML is electrically insulated from, for example, the upper wiring by the interlayer insulating film 17.

Figure 6A:
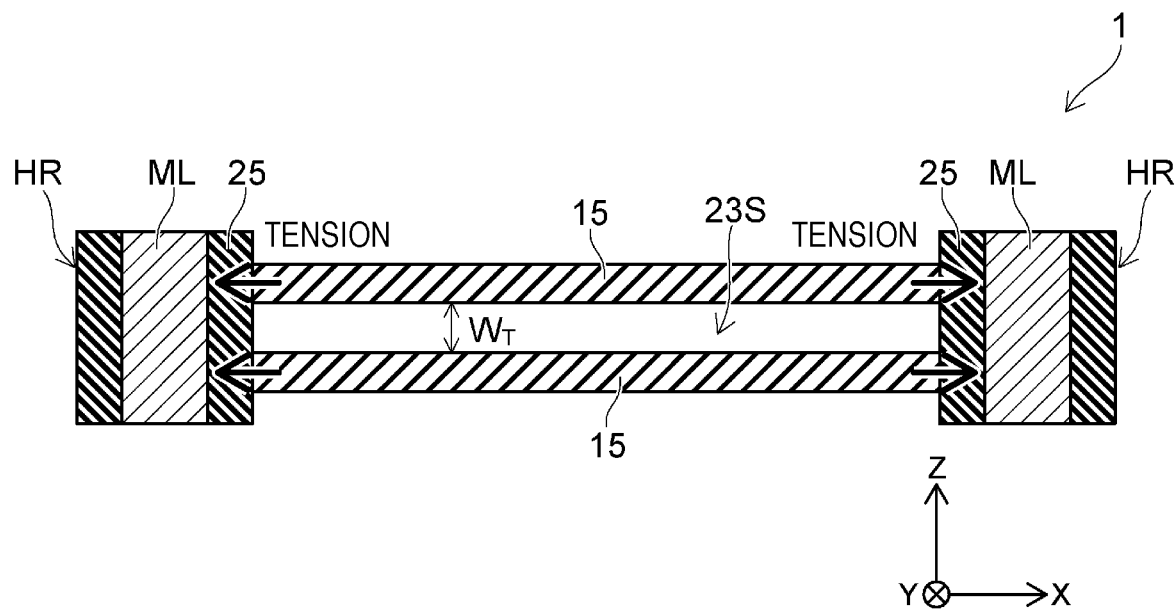
FIGS. 6A and 6B are schematic cross-sectional views illustrating characteristics of the storage device according to the embodiment.
Figure 6B:
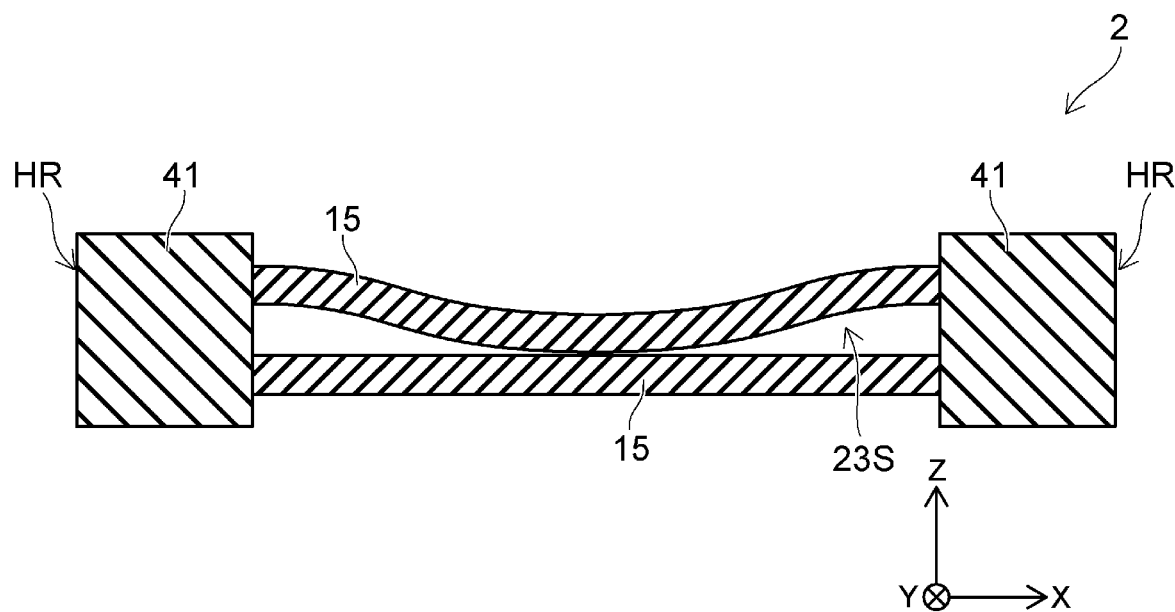

FIGS. 6A and 6B are schematic cross-sectional views illustrating characteristics of the storage device 1 according to the embodiment. FIGS. 6A and 6B are partial cross-sectional views illustrating a state after a sacrificial film 23 is removed and a space 23S is formed between the interlayer insulating films 15 in the processed structure shown in FIG. 4B. FIG. 6A is a schematic diagram illustrating the storage device 1 according to the embodiment, and FIG. 6B is a schematic diagram illustrating a storage device 2 according to a comparative example.

For example, when the storage capacity is increased by increasing the number of stacked word lines WL, from the viewpoint of forming the memory hole MH, the support hole HR, and the slit ST, in order to minimize an increase in etching height due to an increase in the number of stacked word lines WL, it is preferable to reduce the layer thickness of each interlayer insulating film 15 and each sacrificial film 23.

However, when the thickness of the interlayer insulating film 15 is reduced, the rigidity thereof may be reduced, and deflection or the like may occur. Furthermore, when the thickness of the sacrificial film 23 is reduced, the width $W_T$ of the space 23S in the Z direction is narrowed. As a result, it is difficult to secure the space 23S between the interlayer insulating films 15. Such a problem is more serious in the lead-out region HUR in which the interval between the adjacent support holes HR is wider in order to form the contact plug CC.

On the other hand, in the storage device 1 shown in FIG. 6A, due to the film stress caused by the difference in linear expansion coefficient between the insulating film 25 and the metal film ML provided in the support hole HR, a tensile stress is generated between the interlayer insulating film 15 and the insulating film 25. As a result, deflection of the interlayer insulating film 15 is reduced, and the space 23S can be maintained.

On the other hand, the storage device 2 shown in FIG. 6B has a structure in which an insulating film 41 is embedded in the support hole HR. Therefore, no tensile stress is generated between the interlayer insulating film 15 and the insulating film 41, and the deflection of the interlayer insulating film 15 cannot be reduced. As a result, the width $W_T$ of the space 23S is narrowed, and, for example, it is impossible to form the word lines WL or the selection gates SGS and SGD having a uniform thickness. In addition, in some cases, the space 23S may be closed, and the word lines WL and the selection gates SGS and SGD may be disconnected.

As described above, in the embodiment, by disposing the metal film ML inside the support hole HR, it is possible to secure the space 23S after removing the sacrificial film 23. Thereby, the storage capacity of the storage device 1 can be increased, and the manufacturing yield can be improved.

Figure 7A:
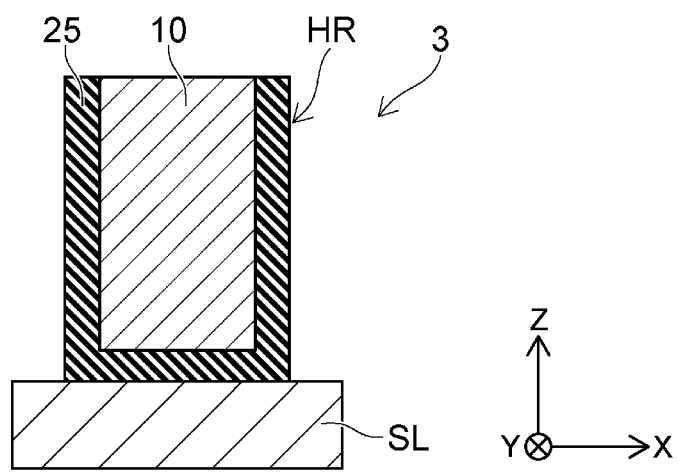
FIGS. 7A to 7C are partial cross-sectional views schematically illustrating a storage device according to a variation of the embodiment.
Figure 7B:
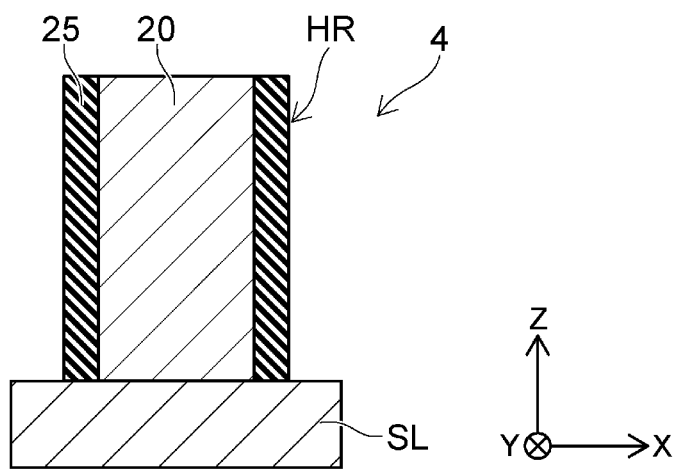
Figure 7C:
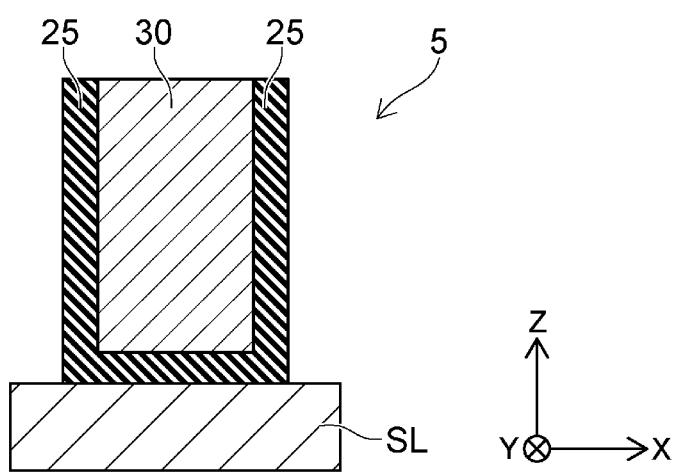

FIGS. 7A to 7C are partial cross-sectional views schematically illustrating storage devices 3 to 5 according to a variation of the embodiment. FIGS. 7A to 7C are schematic diagrams illustrating the internal structure of the support hole HR.

In the example shown in FIG. 7A, the metal film 10 and the insulating film 25 are provided inside the support hole HR. The metal film 10 contains, for example, tungsten (W). The insulating film 25 is provided so as to cover the inner surface of the support hole HR. That is, on the bottom surface of the support hole HR, the metal film 10 is electrically insulated from the source layer SL.

By insulating the metal film 10 from the source layer SL, for example, the parasitic capacitance between the source layer SL and the word lines WL is reduced. This makes it possible to prevent a decrease in the response speed of the memory cell MC.

In the example shown in FIG. 7B, the semiconductor film 20 and the insulating film 25 are provided inside the support hole HR. The semiconductor film 20 contains, for example, polysilicon. The insulating film 25 is provided so as to cover the inner wall of the support hole HR. That is, the semiconductor film 20 is electrically insulated from the word lines WL, and the selection gates SGS and SGD by the insulating film 25.

In this way, by embedding a semiconductor in the support hole HR, a tensile stress can be generated between the interlayer insulating film 15 and the insulating film 25. For example, amorphous silicon is embedded in the support hole HR, and then heat treatment is performed to change the amorphous silicon to polysilicon. Thereby, a large tensile stress can be generated between the interlayer insulating film 15 and the insulating film 25.

It is also possible to reduce the parasitic capacitance between the word lines WL and the source layer SL by embedding a semiconductor which is not intentionally doped with impurities, so-called a non-doped semiconductor, in the support hole HR.

In the example shown in FIG. 7C, the insulating film 25 and a semiconductor film 30 are provided inside the support hole HR. The semiconductor film 30 contains, for example, non-doped polysilicon. The insulating film 25 is provided so as to cover the inner surface of the support hole HR. The semiconductor film 30 is electrically insulated from the word lines WL, and the selection gates SGS and SGD by the insulating film 25. Further, on the bottom surface of the support hole HR, the semiconductor film 30 is electrically insulated from the source layer SL.

In this example, a large tensile stress is generated between the interlayer insulating film 15 and the insulating film 25, and a leak component between the source layer SL and the semiconductor film 30 can be removed. In addition, the parasitic capacitance between the word lines WL and the source layer SL can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device, comprising:
    a conductive layer;
    a plurality of electrode layers stacked on the conductive layer;
    a wiring above the plurality of electrode layers;
    an interlayer insulating film between the plurality of electrode layers and the wiring;
    a semiconductor film extending in a stacking direction of the plurality of electrode layers;
    a contact plug extending in the stacking direction, and connected to each of the plurality of electrode layers; and
    a conductive film in the vicinity of the contact plug and penetrating at least one of the plurality of electrode layers in the stacking direction,
    wherein the semiconductor film is electrically connected to the conductive layer and the wiring, and
    an entire upper end of the conductive film is covered by an insulating layer.

2. The storage device according to claim 1, further comprising:
    a first insulating film between the plurality of electrode layers and the semiconductor film and extending in the stacking direction; and
    a second insulating film between at least one of the plurality of electrode layers and the conductive film and extending along the conductive film in the stacking direction.

3. The storage device according to claim 1, wherein the conductive film contains a metal.

4. The storage device according to claim 3, wherein the metal is W.

5. The storage device according to claim 3, wherein the conductive film includes a first metal extending in the stacking direction and a second metal covering a surface of the first metal.

6. The storage device according to claim 5, wherein the first metal is W and the second metal is TiN.

7. The storage device according to claim 1, wherein the conductive film penetrates the plurality of electrode layers in the stacking direction and reaches a source layer.

8. The storage device according to claim 1, wherein the interlayer insulating film covers the entire upper end of the conductive film.

9. A storage device, comprising:
    a conductive layer;
    a plurality of electrode layers stacked on the conductive layer;
    a wiring above the plurality of electrode layers;
    an interlayer insulating film between the plurality of electrode layers and the wiring;
    a semiconductor film in a memory region extending in a stacking direction of the plurality of electrode layers;
    a contact plug extending in the stacking direction, and connected to each of the plurality of electrode layers; and
    a conductive film in a contact region and penetrating at least one of the plurality of electrode layers in the stacking direction,
    wherein the semiconductor film is electrically connected to the conductive layer and the wiring, and
    an entire upper end of the conductive film is covered by an insulating layer.

10. The storage device according to claim 9, further comprising:
    a first insulating film between the plurality of electrode layers and the semiconductor film and extending in the stacking direction; and
    a second insulating film between at least one of the plurality of electrode layers and the conductive film and extending along the conductive film in the stacking direction.

11. The storage device according to claim 9, wherein the conductive film contains a metal.

12. The storage device according to claim 11, wherein the metal is W.

13. The storage device according to claim 11, wherein the conductive film includes a first metal extending in the stacking direction and a second metal covering a surface of the first metal.

14. The storage device according to claim 13, wherein the first metal is W and the second metal is TiN.

15. The storage device according to claim 9, wherein the conductive film penetrates the plurality of electrode layers in the stacking direction and reaches a source layer.

16. The storage device according to claim 9, wherein the interlayer insulating film covers the entire upper end of the conductive film.

* * * * *